(12) United States Patent
Jeon

(10) Patent No.: US 6,562,491 B1
(45) Date of Patent: May 13, 2003

(54) PREPARATION OF COMPOSITE HIGH-K DIELECTRICS

(75) Inventor: Joong Jeon, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/977,922

(22) Filed: Oct. 15, 2001

(51) Int. Cl.[7] ................................................. B32B 15/04
(52) U.S. Cl. ........................ 428/697; 428/701; 428/702; 257/411
(58) Field of Search ............................ 438/778, 785; 428/697

(56) References Cited

U.S. PATENT DOCUMENTS

| | | | |
|---|---|---|---|
| 5,120,672 A | 6/1992 | Mitchell et al. | 437/43 |
| 5,434,109 A | 7/1995 | Geissler et al. | 437/239 |
| 6,008,091 A | 12/1999 | Gregor et al. | 438/261 |
| 6,013,553 A | 1/2000 | Wallace et al. | 438/287 |
| 6,020,024 A | 2/2000 | Maiti et al. | 427/248.1 |
| 6,020,243 A | 2/2000 | Wallace et al. | 438/287 |
| 6,114,258 A | 9/2000 | Miner et al. | 438/787 |
| 6,163,049 A | 12/2000 | Bui | 257/321 |
| 6,168,958 B1 | 1/2001 | Gardner et al. | 438/3 |
| 6,171,900 B1 | 1/2001 | Sun | 438/240 |
| 6,184,155 B1 | 2/2001 | Yu et al. | 438/763 |
| 6,210,999 B1 | 4/2001 | Gardner et al. | 438/183 |
| 6,258,675 B1 | 7/2001 | Gardner et al. | 438/287 |
| 6,265,268 B1 | 7/2001 | Halliyal et al. | 438/261 |
| 6,278,166 B1 | 8/2001 | Ogle, Jr. | 257/411 |
| 6,291,866 B1 | 9/2001 | Wallace et al. | 257/410 |
| 6,291,867 B1 | 9/2001 | Wallace et al. | 257/410 |
| 6,297,107 B1 | 10/2001 | Paton et al. | 438/291 |
| 6,309,927 B1 | 10/2001 | Au et al. | 438/261 |
| 6,319,730 B1 | 11/2001 | Ramdani et al. | 438/3 |
| 6,319,775 B1 | 11/2001 | Halliyal et al. | 438/261 |
| 6,406,960 B1 | 6/2002 | Hopper et al. | 438/261 |
| 6,407,435 B1 * | 6/2002 | Ma et al. | 257/411 |
| 6,420,279 B1 * | 7/2002 | Ono et al. | 438/785 |

OTHER PUBLICATIONS

Zhang et al., High Permittivity Thin Film Nanolaminates, Feb. 15, 2000, Journal of Applied Physics, vol. 87, No. 4, pp. 1921–1924.*

Kukli et al., Tailoring the Dlelectric Properties of $HfO_2$–$Ta_2O_5$ Nanolaminates, Jun. 24, 1996, Applied Physics Letters, vol. 68, No. 26, pp. 3737–3739.*

* cited by examiner

Primary Examiner—Deborah Jones
Assistant Examiner—G. A. Blackwell-Rudasill
(74) Attorney, Agent, or Firm—Renner, Otto, Boisselle & Sklar, LLP (57) ABSTRACT

A semiconductor device and a method of making the semiconductor device having a composite dielectric layer including steps of providing a semiconductor substrate; depositing on the semiconductor substrate alternating sub-layers of a high-K dielectric material and a dielectric precursor material to form a composite layer having at least two sub-layers of at least one of the high-K dielectric material and the dielectric precursor material. The semiconductor device may be subjected to annealing at an elevated temperature to form a composite dielectric layer from the composite layer.

17 Claims, 4 Drawing Sheets

PREPARATION OF COMPOSITE HIGH-K DIELECTRICS

FIELD OF THE INVENTION

The invention relates generally to the fabrication of semiconductor devices and, more particularly, to the fabrication of high-K dielectric layers in semiconductor devices.

BACKGROUND OF THE INVENTION

Fabrication of semiconductor devices, such as a metal-oxide-semiconductor (MOS) integrated circuit, involves numerous processing steps. In a semiconductor device, a gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. A pervasive trend in modern integrated circuit manufacture is to produce transistors having feature sizes as small as possible. Many present processes employ features, such as gate conductors and interconnects, which have less than 0.18 μm critical dimension. As feature sizes continue to decrease, the size of the resulting transistor as well as the interconnect between transistors also decreases. Fabrication of smaller transistors allows more transistors to be placed on a single monolithic substrate, thereby allowing relatively large circuit systems to be incorporated on a single, relatively small die area.

As MOSFET feature sizes decrease, gate oxide thickness decreases as well. This decrease in gate oxide thickness is driven in part by the demands of overall device scaling. As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices. For example, a maximum value of MOSFET subthreshold current can be maintained while feature sizes shrink, by decreasing any or all of several quantities, including gate oxide thickness, operating voltage, depletion width, and junction depth, by appropriate amounts.

As a result of the continuing decrease in feature size, gate oxide thickness has been reduced so much that oxides are approaching thicknesses on the order of ten angstroms (Å). Unfortunately, thin oxide films may break down when subjected to an electric field, particularly for gate oxides less than 50 Å thick. It is probable that even for a relatively low gate voltage of 3V, electrons can pass through such a thin gate oxide by a quantum mechanical tunneling effect. In this manner, a tunneling current may undesirably form between the semiconductor substrate and the gate conductor, adversely affecting the operability of the device. It is postulated that some of these electrons may become entrapped within the gate oxide by, e.g., dangling bonds. As a result, a net negative charge density may form in the gate oxide. As the trapped charge accumulates with time, the threshold voltage $V_T$ may shift from its design specification. Breakdown of the gate oxide may also occur at even lower values of gate voltage, as a result of defects in the gate oxide. Such defects are unfortunately prevalent in relatively thin gate oxides. For example, a thin gate oxide often contains pinholes and/or localized voids due to unevenness at which the oxide grows on a less than perfect silicon lattice.

A more promising approach to further increasing gate dielectric capacitance may be to increase the permittivity of the gate dielectric. Permittivity, $\in$, of a material reflects the ability of the material to be polarized by an electric field. The permittivity of a material is typically described as its permittivity normalized to the permittivity of a vacuum, $\in_0$. Hence, the relative permittivity, referred to as the dielectric constant, of a material is defined as:

$K=\in/\in_0$

While silicon dioxide (sometimes simply referred to as "oxide") has a dielectric constant of approximately 3.9, other materials have higher K values. Silicon nitride ("nitride"), for example, has a K of about 6 to 9 (depending on formation conditions). Much higher K values of, for example, 20 or more can be obtained with various transition metal oxides including tantalum oxide ($Ta_2O_5$), barium strontium titanate ("BST"), and lead zirconate titanate ("PZT"). Using a high-K dielectric material for a gate dielectric would allow a high capacitance to be achieved even with a relatively thick dielectric layer. For example, a nitride gate dielectric with a K of 7.8 and a thickness of 100 angstroms is substantially electrically equivalent to an oxide gate dielectric (K about 3.9) having a thickness of about 50 angstroms. For even higher-K dielectric materials, even thicker gate dielectric layers could be formed while maintaining capacitance values higher than are possible with even very thin oxide layers. In this way, the reliability problems associated with very thin dielectric layers may be avoided while transistor performance is increased.

One problem which has been reported relating to integration of high-K dielectric materials is oxidation of silicon by certain high-K dielectric materials when the high-K dielectric material is formed directly on a silicon substrate. Since oxidation results in formation of what may be referred to as a "standard-K" dielectric material, some of the benefit of the high-K dielectric material is considered to be lost. In addition, reactions considered adverse between the high-K dielectric material and standard-K dielectric materials may also occur.

Thus, a method of forming a relatively high-K dielectric material which either overcomes or takes advantage of such reactions, and which provides the electrical advantages of a higher K is needed.

SUMMARY OF THE INVENTION

The present invention, in a first embodiment, relates to a method of making a semiconductor device having a composite layer, including the steps of providing a semiconductor substrate; depositing on the semiconductor substrate alternating sub-layers of a high-K dielectric material and a dielectric precursor material to form a composite layer having at least two sub-layers of at least one of the high-K dielectric material and the dielectric precursor material.

The present invention, in a second embodiment, relates to a method of making a semiconductor device having a composite dielectric layer formed by exposing the composite layer to annealing conditions including an elevated temperature to form a composite dielectric layer.

The present invention further relates to a semiconductor device having a composite layer, including a semiconductor substrate; and alternating sub-layers of a high-K dielectric material and a second material, the sub-layers forming a composite layer on the semiconductor substrate, the composite layer having at least two sub-layers of at least one of the high-K dielectric material and the second material, wherein the second material is one of a dielectric precursor material and a second high-K dielectric material. The semiconductor device having a composite layer, when subjected to annealing conditions as described above, may be transformed into a semiconductor device having a composite dielectric layer.

Thus, the present invention relates to a high-K dielectric material which overcomes and takes advantage of previously disfavored reactions between dielectric materials, and relates to a method of making a composite dielectric layer which may include a reaction product of the high-K dielectric material and the dielectric precursor material or a new dielectric material, which is obtained by subjecting the composite layer to annealing conditions.

DETAILED DESCRIPTION

As used herein, the term "dielectric precursor material" refers to a material which is capable of forming a dielectric material upon exposure to an elevated temperature and any other appropriate conditions, such as a selected atmosphere.

Such dielectric precursor materials include, for example, silicon, aluminum, hafnium, zirconium, yttrium, titanium, tantalum, lanthanum, cesium, tungsten, magnesium, zinc, barium, strontium, bismuth, niobium, scandium and combinations of these and other materials. A person of skill in the art may recognize other suitable dielectric precursor materials. The dielectric precursor materials may form either standard-k or high-K dielectric materials upon exposure to elevated temperatures.

As used herein, the term "standard-K dielectric material" refers to a dielectric material having a K up to about 10.

Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9.

As used herein, the term "mid-K dielectric material" refers to a dielectric material having a K in the range from about 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric material" refers to a dielectric material having a K of about 20 or more. Such high-K dielectric materials include, for example, $HfO_2$, $ZrO_2$, $Ta_2O_5$, others identified more fully below, and composites of these, as described more fully below.

Approximate K-values or, in some cases, a range of K-values, are shown below in Table 1 for several exemplary dielectric materials. It is understood that the present invention is not limited to the specific dielectric materials disclosed herein, but may include any appropriate high-K dielectric materials and standard-K dielectric materials (derived from the dielectric precursor material described hereinbelow) which are known and are compatible with the remaining elements of the semiconductor device with which the dielectric materials are to be used.

TABLE 1

| Dielectric Material | Dielectric Constant (K) (Relative Permittivity) |
|---|---|
| silicon dioxide | 3.9 |
| silicon nitride | 6–9 |
| silicon oxynitride | 4–8 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cesium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| barium titanate, $BaTiO3$ | 100 |
| BST ($Ba_{1-x}Sr_xTiO_3$) | ~20—200 |
| barium strontium oxide ($Ba_{1-x}Sr_xO_3$) | ~20—200 |
| PST ($PbSc_xTa_{1-x}O_3$) | ~3000 |
| PZN ($PbZn_xNb_{1-x}O_3$) | ~7000 |
| PZT ($PbZr_xTi_{1-x}O_3$) | ~150—600 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

As used herein, the term "anneal" or "annealing" refers to a step or process in which a material is exposed to an elevated temperature for a time. The annealing may be a discrete step of annealing, such as a RTA, or it may be part of another step, such as a CVD, which is carried out at an elevated temperature. In either case, annealing includes exposure to an elevated temperature, and may include appropriate additional conditions, such as a selected atmosphere and pressure, for a selected period of time.

Semiconductor Devices

Figure 1:
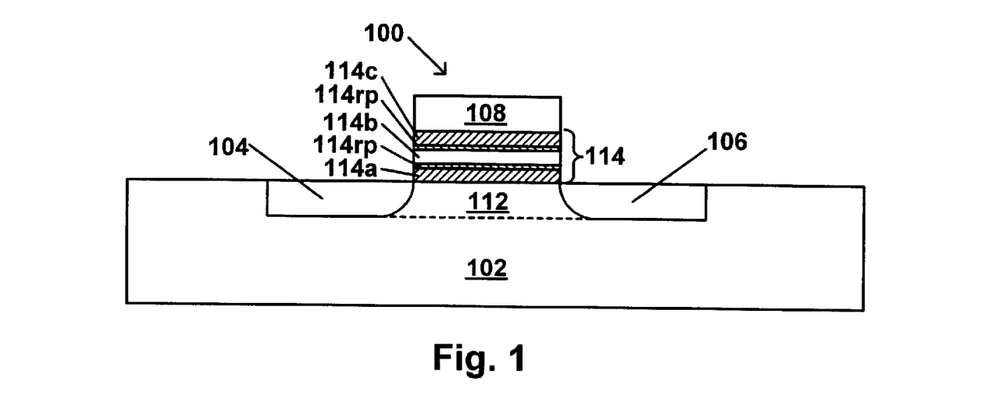
FIG. 1 is a schematic cross-sectional view of a field effect transistor including an embodiment of a composite dielectric layer in accordance with the present invention.

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a dielectric layer is needed, for example, as a gate dielectric in a FET, as a gate dielectric in a floating gate EEPROM flash memory device, in a SONOS-type flash memory device, such as the Mirror-Bit™ SONOS-type flash memory device available from AMD. Thus, it is to be understood that the present invention is not limited to the specific illustrative embodiments described below.

Figure 4:
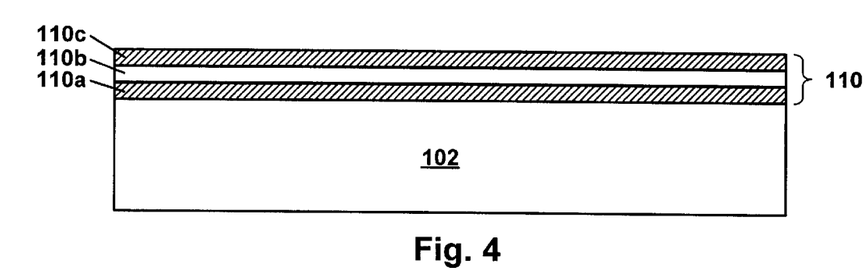
FIG. 4 is a schematic cross-sectional view of a semiconductor substrate with first, second and third sub-layers applied thereto in accordance with the present invention.
Figure 5:
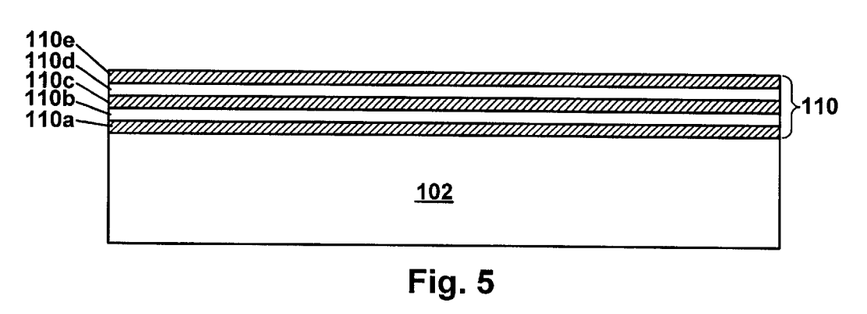
FIG. 5 is a schematic cross-sectional view of a semiconductor substrate with first through fifth sub-layers applied thereto in accordance with the present invention.
Figure 6:
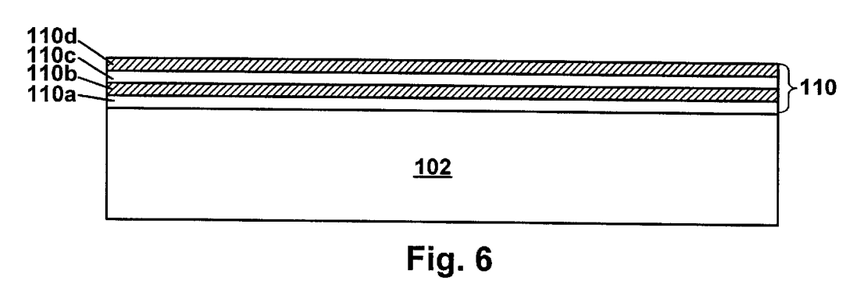
FIG. 6 is a schematic cross-sectional view of a semiconductor substrate with first through fourth sub-layers applied thereto in accordance with the present invention.

The present invention relates to semiconductor devices and to methods of making the semiconductor devices. In a first embodiment, the semiconductor device includes a composite layer including a plurality of alternating sub-layers of a high-K dielectric material and a dielectric precursor material which have been deposited on the semiconductor substrate. The composite layer has at least two sub-layers of at least one of the high-K dielectric material and the dielectric precursor material. Examples of the first embodiment are shown in FIGS. 4–6.

In a second embodiment, the semiconductor device includes a composite dielectric layer including a plurality of alternating sub-layers of a high-K dielectric material and a dielectric material formed from the dielectric precursor material upon annealing at a high temperature. As a result of annealing the device including the composite layer of the first embodiment, the device including the composite dielectric layer of the second embodiment is formed. In one embodiment, the composite dielectric layer includes alternating sub-layers of a high-K dielectric material and a new dielectric material. In one embodiment, the new dielectric material is a standard-K dielectric material, and in another embodiment the new dielectric material is a second high-K dielectric material which is distinct from the first (originally deposited) high-K dielectric material. In another embodiment, the composite dielectric layer includes a reaction product, made up of elements of the high-K dielectric material and of the dielectric precursor material or of the newly formed dielectric material. In one embodiment, the composite dielectric layer comprises a reaction product of the high-K material and the newly formed dielectric material which is a metal silicate.

Figure 7:
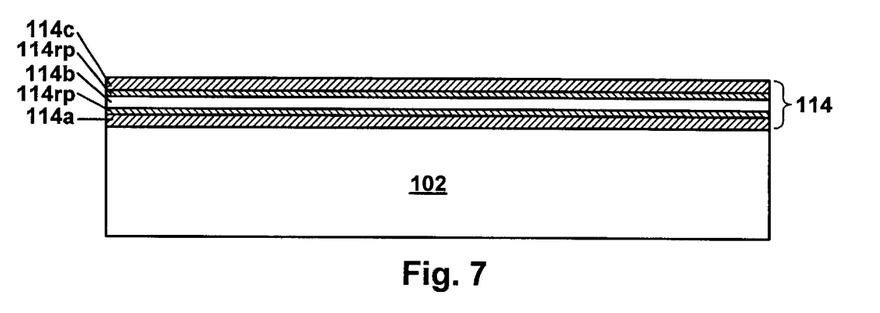
FIG. 7 is a schematic cross-sectional view of one embodiment of a semiconductor substrate following a step of annealing.
Figure 8:
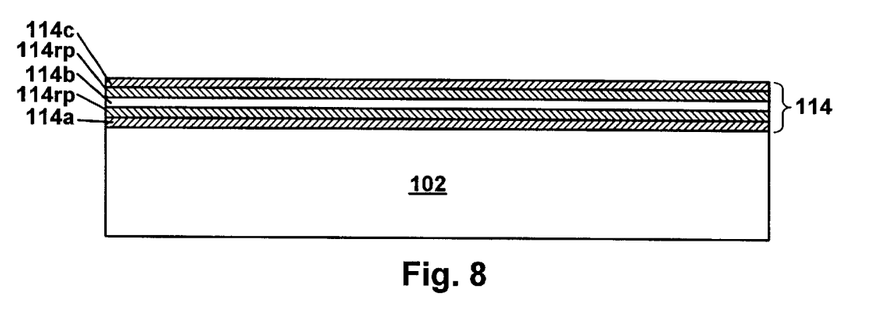
FIG. 8 is a schematic cross-sectional view of another embodiment of a semiconductor substrate following a step of annealing, similar to that shown in FIG. 7.
Figure 9:
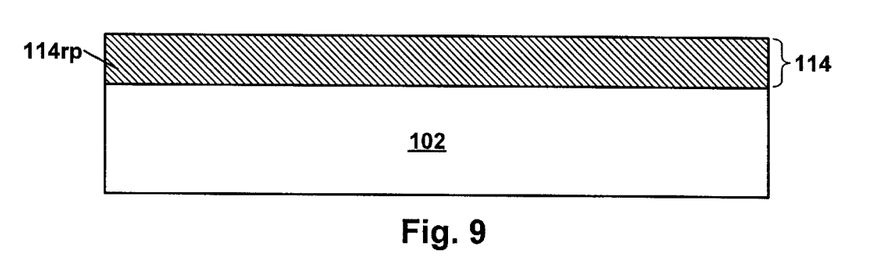
FIG. 9 is a schematic cross-sectional view of yet another embodiment of a semiconductor substrate following a step of annealing, similar to that shown in FIGS. 7 and 8.

In one embodiment, at the annealing temperature, the dielectric precursor material first is oxidized to form a new, second dielectric material. The new dielectric material, in one embodiment, is a standard-K dielectric material. The new dielectric material, in another embodiment, is a high-K dielectric material. As a result, alternating sub-layers of high-K dielectric material and the new dielectric material are formed. In one embodiment, at the annealing temperature, at least a portion of the alternating sub-layers combine or react with each other, at least at the interfaces of the alternating sub-layers, to form the composite dielectric layer which includes a reaction product of the dielectric materials of the respective sub-layers. Examples of the second embodiment are shown in FIGS. 7–9.

As described above, in the present invention, two embodiments of a semiconductor device are produced, with the device of the first embodiment capable of being transformed into the device of the second embodiment by a high temperature annealing step.

The reaction product and/or the composite dielectric layer as a whole may have a K-value intermediate the K-values of the high-K dielectric material and the new dielectric material which is formed from the dielectric precursor material. In an embodiment in which a reaction product is formed, the reaction product is a composite of the high-K dielectric material and the new dielectric material, so may have a K value which is intermediate the K values of the respective dielectric materials from which the reaction product was formed. Thus, in some embodiments, the reaction product and/or the composite dielectric layer as a whole may be a mid-K dielectric material. In some embodiments, the reaction product and/or the composite dielectric layer as a whole may have a high K value, i.e., may be a high-K dielectric material.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

FIG. 1 is a schematic cross-sectional view of a MOSFET 100. The MOSFET 100 includes, for example, a p-doped silicon substrate 102, an n-doped source region 104, an n-doped drain region 106, a gate 108, a gate composite dielectric layer 114, and a channel region 112.

Not shown in FIG. 1 are additional parts of a working semiconductor device, such as electrical conductors, protective coatings and other parts of the structure which would be included in a complete, working semiconductor device. These additional parts are not necessary to the present invention, and for simplicity and brevity are neither shown nor described, but could be easily added as will be understood by those of skill in the art.

The gate composite dielectric layer 114 illustrated in FIG. 1 has a structure including five sub-layers; thus the gate dielectric 114 is a composite dielectric layer. The gate composite dielectric layer 114 illustrated in FIG. 1 has two sub-layers 114a and 114c of a first material and one sub-layer 114b of a second material, and two sub-layers 114rp of a reaction product obtained by the reaction or combination of the first and second materials of the sub-layers 114a–114c. One of the first and second materials is the high-K dielectric material and the other is the dielectric precursor material.

The composite dielectric layer 114 illustrated in FIG. 1 comprises three alternating sub-layers 114a–114c, separated by reaction product sub-layers 114rp. The composite dielectric layer 114 could comprise any number of additional alternating sub-layers 114a–114ω, where ω represents a letter corresponding to the number of sub-layers, from 3 to about 10, with each pair of sub-layers separated by a reaction product sub-layer 114rp, following the annealing step. In one embodiment, the composite layer includes four alternating sub-layers (ω=4), in another, five alternating sub-layers (ω=5), and in another, six alternating sub-layers (ω=6), and in yet another, seven alternating sub-layers (ω=7). Higher numbers of alternating sub-layers may be present, but from 3 to about 7 alternating sub-layers ω=3–7) are considered most useful at present. In each case, the sub-layers of dielectric materials, following the annealing step, are separated by a reaction product sub-layer 114rp. As described more fully below, the relative thickness of these sub-layers may be selected and controlled as desired.

The foregoing paragraph applies equally to the composite layer 110 of the first embodiment, shown in FIGS. 4–6, except that there are no sub-layers of a reaction product in the first embodiment. Thus, the composite layer I 10 could comprise any number of additional alternating sub-layers 110a–110ω, where ω represents a letter corresponding to the number of sub-layers, from 3 to about 10.

The composite layer 110 shown in FIG. 4 includes two similar sub-layers 110a and 110c, and a dissimilar third sub-layer, 110b. In one embodiment, the two similar sub-layers 110a and 110c each comprise a high-K dielectric material, and the dissimilar third sub-layer 110b comprises a dielectric precursor material. In another embodiment, the opposite arrangement is used, i.e., the two similar sub-layers 110a and 110c each comprise a dielectric precursor material, and the dissimilar third sub-layer 110b comprises a high-K dielectric material. In another embodiment, the dielectric precursor material is replaced by a new dielectric material. In one embodiment, the new dielectric material is a second high-K dielectric material. In one embodiment, the second high-K dielectric material is different from the first, originally deposited high-K dielectric material.

In the embodiment shown in FIG. 5, the composite layer 110 comprises five sub-layers, 110a–110e, alternating in a pattern which continues the alternating pattern described above for three sub-layers 110a–110c.

In the embodiment shown in FIG. 6, the composite layer 110 comprises four sub-layers, 110a–110d, alternating in a pattern which is similar to that described above for three sub-layers 110a–110c, except that the lowermost and uppermost sub-layers, 110a and 110d, are different in this embodiment. In other embodiments, the number of sub-layers may vary as described above, but the sub-layers alternate in each such embodiment.

As noted above with respect to FIG. 6, in an embodiment in which there is an even number of sub-layers in the composite layer 110, the lowermost sub-layer may be a high-K dielectric material and the uppermost sub-layer may be a dielectric precursor material. In another embodiment having an even number of sub-layers in the composite layer 110, the lowermost sub-layer may be a dielectric precursor material and the uppermost sub-layer may be a high-K dielectric material. FIG. 6 is applicable to either even number sub-layer case.

Thus, the number of sub-layers 110a–110ω of the composite layer 110 may be odd or even, and the uppermost and lowermost sub-layers may be either the high-K dielectric material, the dielectric precursor material, or the new dielectric material and the number of sub-layers of each type may be equal or unequal.

The first sub-layer may be the high-K dielectric material or the dielectric precursor material, and conversely, the second sub-layer may be the high-K dielectric material or the dielectric precursor material.

In one embodiment, the dielectric precursor material includes silicon. In one embodiment, the silicon is deposited as polycrystalline silicon (also known simply as "poly"). In another embodiment, the silicon is deposited as amorphous silicon. In one embodiment, the dielectric precursor material comprises elements other than or in addition to silicon, such as germanium or gallium, which will form a dielectric material upon annealing.

In another embodiment, the dielectric precursor material comprises at least one of aluminum, hafnium, zirconium, yttrium, titanium, tantalum, lanthanum, cesium, tungsten, magnesium, zinc, barium, strontium, bismuth, niobium and scandium and combinations thereof, or combinations thereof with silicon.

The dielectric precursor material is a material which, when oxidized under the annealing conditions, forms the new dielectric material, as described above.

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cesium oxide ($CeO_2$), lanthanum oxide ($La_2O_3$), tungsten oxide ($WO_3$), yttrium oxide ($Y_2O_3$), bismuth silicon oxide ($Bi_4Si_2O_{12}$), barium strontium oxide ($Ba_{1-x}Sr_xO_3$), barium strontium titanate (BST) ($Ba_{1-x}Sr_xTiO_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead zirconium titanate, lead lanthanum titanate, strontium bismuth tantalate, bismuth titanate, strontium titanate, lead zirconium titanate (PZT ($PbZr_xTi_{1-x}O_3$)) and barium zirconium titanate may be suitably used in the present invention. Other high-K dielectric materials known in the art also may be used in the present invention.

The reaction product 114rp includes the elements of both the high-K dielectric material and the new dielectric material formed from the dielectric precursor material. For example, in an embodiment in which the high-K dielectric material is hafnium oxide and the dielectric precursor material is silicon, the reaction product is a silicate compound containing hafnium, silicon and oxygen, Hf/Si/O. In one embodiment, the reaction product is hafnium silicate, $HfSiO_4$. Thus, in an embodiment in which the high-K dielectric material contains a metal atom, e.g., in the form of a metal oxide, and the dielectric precursor material is silicon, the reaction product is a metal-containing silicate.

In another embodiment, the high-K dielectric material is zirconium oxide and the dielectric precursor material is silicon, and the composite dielectric layer includes zirconium, silicon and oxygen. In one such embodiment, the reaction product is zirconium silicate, $ZrSiO_4$. In yet another embodiment, the high-K dielectric material is cesium oxide and the dielectric precursor material is silicon, and the composite dielectric layer includes cesium, silicon and oxygen. In still another embodiment, the high-K dielectric material is tantalum oxide and the dielectric precursor material is silicon, and the composite dielectric layer includes tantalum, silicon and oxygen. As demonstrated by the foregoing embodiments, the reaction product is a composite of the high-K dielectric material and the dielectric precursor material.

In another embodiment, the first, originally deposited high-K dielectric material is one of those described above and the new dielectric material is a second high-K dielectric material. In one embodiment, the first and second high-K dielectric materials are included in the composite dielectric layer as discrete sub-layers, with substantially no reaction product formed between the respective sub-layers. In another embodiment, sub-layers of the first and second high-K dielectric materials are included in the composite dielectric layer separated by sub-layers of a reaction product formed during the annealing step and including elements of both the first and second high-K dielectric materials.

In one embodiment, the reaction product has a K in the range from about 10 to about 20. In another embodiment, the reaction product has a K which is intermediate the K of the high-K dielectric material and the K of a dielectric material formed from the dielectric precursor material. Thus, the reaction product, or composite dielectric layer as a whole, may be conveniently referred to as a mid-K dielectric material, as defined above.

In one embodiment, the reaction product has a K which can be estimated by finding the weighted average of the K's of the high-K dielectric material and the new dielectric material formed from the dielectric precursor material. For example, a reaction product having a K of about 14 would be obtained from an equal number of sub-layers of equal thickness of hafnium oxide, having a K of about 24, and silicon dioxide formed from a sub-layer of silicon as the dielectric precursor material, having a K of about 3.9.

The composite dielectric layer, in one embodiment, is an amorphous material. In one embodiment, the composite dielectric layer of the present invention has an amorphous structure, when formed from hafnium oxide, a usually crystalline material, and silicon dioxide formed from a sub-layer of silicon as the dielectric precursor material, an amorphous material. In an embodiment in which the high-K dielectric material is normally crystalline, and in which at least a partial sub-layer of the high-K dielectric material remains in the composite dielectric layer, the high-K dielectric material may be present in a crystalline form or may be rendered amorphous. The normally crystalline high-K material may be rendered amorphous or less crystalline by the proximity of the amorphous reaction product or the amorphous (e.g., oxide) dielectric form of the dielectric precursor material.

The sub-layers may be applied in thicknesses and numbers appropriate to the desired final, total thickness of the composite dielectric layer. In one embodiment, the thicknesses and numbers of the sub-layers are selected to control the K-value of the composite dielectric layer, in one to control the relative amounts of each metal from which the respective high-K dielectric materials are comprised in the composite dielectric layer, and in one, to control the ratios of metal to silicon to oxygen in the composite dielectric layer.

For example, if a total final thickness of 50 angstroms (Å) is desired, three sub-layers of about 17 Å each, four sub-layers of about 12.5 Å each, or five sub-layers of about 10 Å may be used. With respect to, for example, the ratio of metal to silicon in the composite dielectric layer, consider a case in which the ratio of metal to silicon is desired to be relatively high. Five sub-layers of about 10 Å each may be used, in which the first and third and fifth sub-layers are, for example, hafnium oxide, and the second and fourth sub-layers are silicon. This arrangement will yield a dielectric layer relatively rich in hafnium, as compared to a composite using, for example, four sub-layers of about 12.5 Å, in which two of the sub-layers are hafnium oxide and two of the sub-layers are silicon. If a further increase in the K value, or in the ratio of metal to silicon in the composite dielectric layer is desired, the thicknesses of the sub-layers of high-K dielectric material may be increased with respect to the thicknesses of the dielectric precursor material. Similarly, an increase in the relative thickness or number of sub-layers of dielectric precursor material vis-a-vis the high-K dielectric material will reduce the K of the composite dielectric layer, as compared to a composite dielectric layer having relatively less thick or less numerous sub-layers of dielectric precursor material vis-a-vis the high-K dielectric material. Similar considerations can be applied to selection of the ratio of metals and to the selection of a desired K value for the composite dielectric layer.

It is noted that, to obtain a given thickness of the new dielectric material, e.g., silicon dioxide or hafnium dioxide, a lesser thickness of silicon or hafnium should be deposited, since the silicon dioxide or hafnium dioxide formed by oxidation of silicon or hafnium occupies a larger volume than does the originally deposited material.

The composite layer 110 and the composite dielectric layer 114 shown in FIGS. 1–9 are depicted with discrete sub-layers. When the sub-layers, e.g., the sub-layers 110a, 110b and 110c, are deposited, the sub-layers are discrete as shown in FIGS. 2–6, for example. Following the step of annealing described above, in which the respective high-K dielectric material and the new dielectric material in the sub-layers may combine or react with each other to form the reaction product, to some degree each of the discrete sub-layers, including the sub-layers 114rp of the reaction product, will be blended into the adjacent sub-layers, so that the boundary from one sub-layer to the next may be indeterminate. Thus, the various sub-layers shown in the drawings are depicted with discrete boundaries, but this may not be the case in actual practice.

Method of Making a Composite Layer and Converting it into a Composite Dielectric Layer in a Semiconductor Device The present invention further relates to a method of making the above-described semiconductor devices. Thus, in one embodiment, the present invention includes a method of making a semiconductor device having a composite layer. In another embodiment, the present invention includes a method of making a semiconductor device having a composite dielectric layer, which may be formed by annealing the composite layer of the first embodiment. The first method includes the steps of providing a semiconductor substrate; depositing on the semiconductor substrate alternating sub-layers of a high-K dielectric material and a second dielectric material, which together form the composite layer. In one embodiment, the composite layer has at least two sub-layers of at least one of the high-K dielectric material and the dielectric precursor material. This provides the semiconductor device having a composite layer of a high-K dielectric material and a dielectric precursor material.

When the semiconductor device including the composite layer is annealed at or is otherwise exposed to elevated temperature, the semiconductor device including the composite dielectric material is formed. During the annealing, the dielectric precursor material is oxidized to form a new dielectric material, and the high-K dielectric material and the new dielectric material react together or combine to form a composite dielectric layer which includes a reaction product of the respective high-K dielectric material and new dielectric material. The reaction product is formed at least at the interfaces of the respective alternating sub-layers of high-K dielectric material and new dielectric material.

Figure 10:
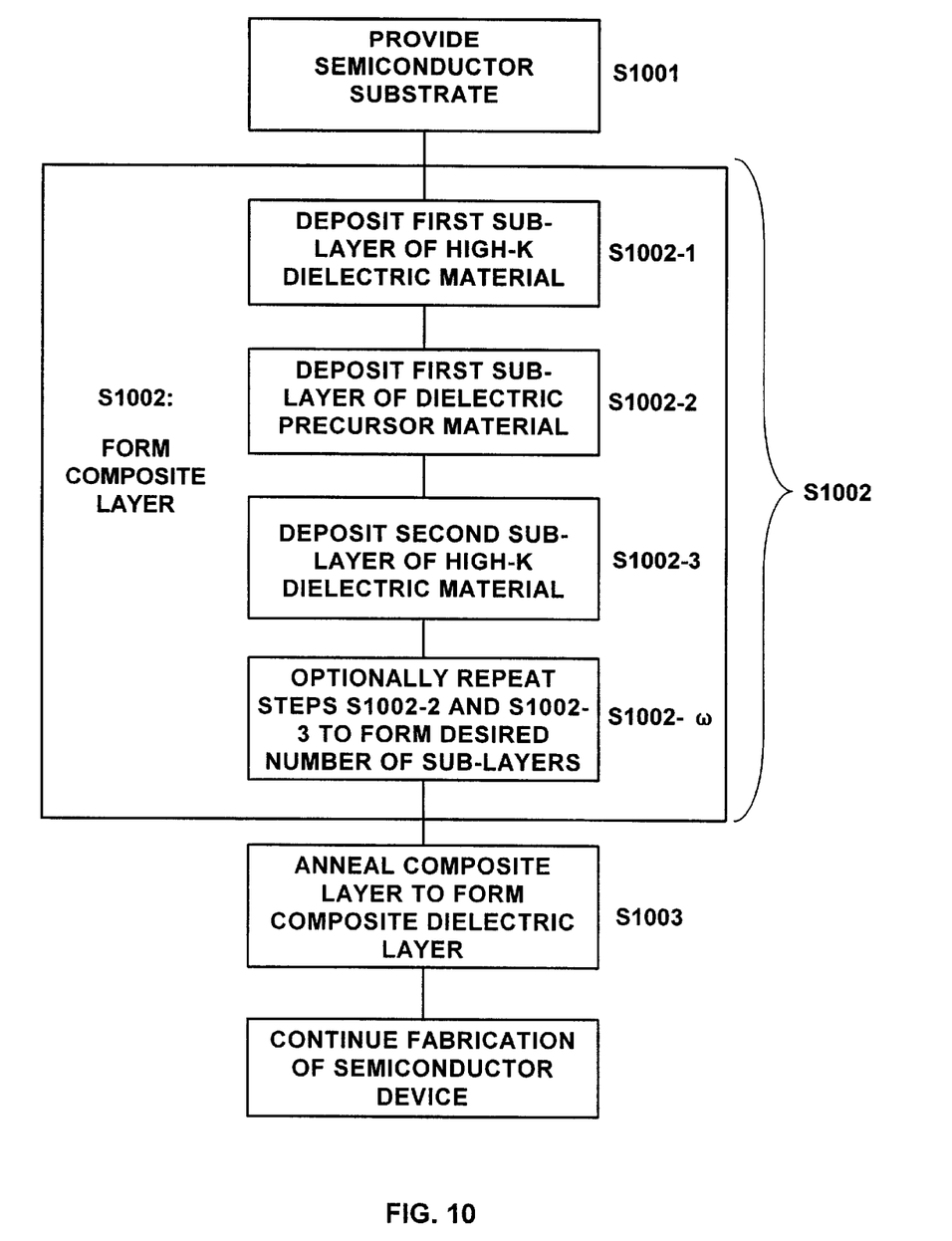
FIG. 10 is a schematic flow diagram showing the basic steps in a process of making a semiconductor device in accordance with the present invention.

The method of making the semiconductor devices described above is set forth in the following disclosure with reference to FIGS. 1–10. FIG. 10 is a flow diagram schematically presenting the steps first of making the composite layer in a semiconductor device and then of transforming the composite layer into the composite dielectric layer in a semiconductor device, in accordance with the present invention.

Making a Composite Layer

Figure 2:
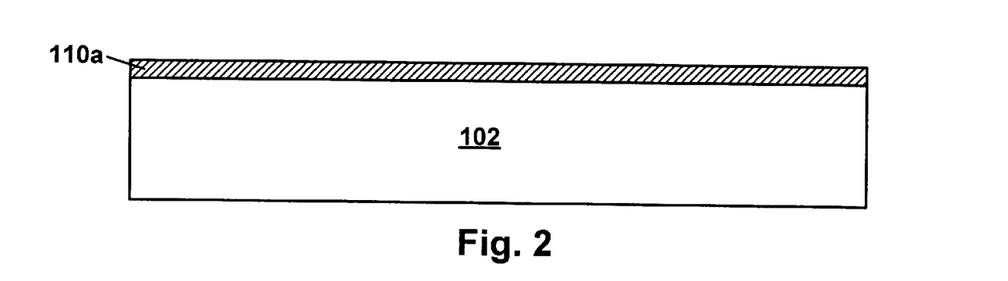
FIG. 2 is a schematic cross-sectional view of a semiconductor substrate with a first sub-layer applied thereto in accordance with the present invention.

In the first step of the method of the present invention, shown in FIG. 10 as Step S1001, a semiconductor substrate 102 is provided, as shown in, e.g., FIG. 2. The semiconductor substrate may be any appropriately selected semiconductor substrate known in the art, as described above.

In the second step of the method of the present invention, shown in FIG. 10 as Step S1002, a series of alternating sub-layers 110a, 110b, 110c, . . . 110ω, of a high-K dielectric material and a dielectric precursor material are formed on the semiconductor substrate 102 resulting in formation of the composite layer 110. As shown in FIG. 10, the second step, S1002, can be broken down into a series of sub-steps S1002-1 . . . S1002-ω, in which the series of alternating sub-layers 110a . . . 110ω are deposited.

In one embodiment, either or both of the high-K dielectric material and the dielectric precursor material may be deposited by chemical vapor deposition (CVD). The CVD method may be any appropriate CVD method known in the art. For example, the CVD method may be ALD, PECVD, RTCVD or MLD. In one embodiment, both the high-K dielectric material and the dielectric precursor material are deposited in the same apparatus. In another embodiment, both the high-K dielectric material and the dielectric precursor material are deposited in the same apparatus, and these materials are deposited sequentially by controlling the supply of precursor materials to the CVD apparatus.

Thus, for example, in an embodiment in which hafnium oxide and silicon are the high-K and dielectric precursor materials, the hafnium is supplied in the form of a hafnium-containing gas or vapor such as tetra-t-butoxyhafnium, the silicon is supplied in the form of silane gas, $SiH_4$, and the oxygen is supplied in the gaseous form. In this embodiment, if the first sub-layer is to be hafnium oxide, the hafnium-containing gas and oxygen are first provided to the CVD apparatus. When a suitable thickness of hafnium oxide has been deposited, the flow of the hafnium-containing gas and oxygen gas is stopped, and a flow of silane gas is provided to the CVD apparatus to deposit silicon. When a suitable thickness of silicon has been deposited, the flow of the silane gas is stopped, and the flow of hafnium-containing gas and oxygen gas is started again, and continued until a suitable thickness of hafnium oxide is deposited. This process of alternating sub-layer deposition is continued until a suitable, selected number of sub-layers of desired thickness has been deposited. Suitable precursor materials for the CVD of other metals (e.g., Zr, Ce, Y, Ti, Ta, Sc, etc) are known in the art and may be appropriately selected.

In an alternative embodiment, the sub-layers may be deposited one at a time, each in a separate apparatus. This alternative embodiment allows for different deposition methods to be used for the respective sub-layers. Thus, for example, when the dielectric precursor material is silicon formed by a different CVD method, it may be carried out in an apparatus separate from the CVD apparatus used for depositing the high-K dielectric material.

FIG. 2 shows the semiconductor substrate 102 after application of a first sub-layer 110b of one of a high-K dielectric material or a dielectric precursor material, i.e., at the completion of sub-step S1002-1.

Figure 3:
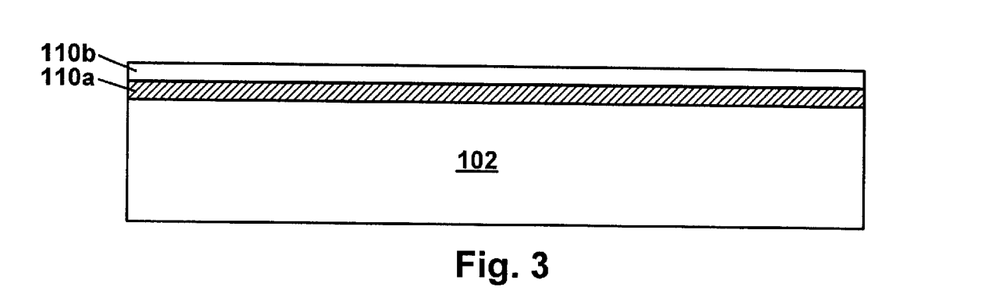
FIG. 3 is a schematic cross-sectional view of a semiconductor substrate with first and second sub-layers applied thereto in accordance with the present invention.

FIG. 3 shows the semiconductor substrate 102 after application of a second sub-layer 110c of the other of a high-K dielectric material or a dielectric precursor material, i.e., at the completion of sub-step S1002-2.

FIG. 4 shows the semiconductor substrate 102 after application of a third sub-layer 110c of the material deposited in the sub-step S1002-1, i.e., at the completion of sub-step S1002-3.

As indicated in step S1002-n in FIG. 10, the sub-steps S1002-2 and S1002-3 of the Step S1002 may be repeated and continued until a selected number ω of sub-layers 110ω has been deposited to form a composite layer 110. In the embodiment illustrated in FIG. 4, sub-steps S1002-1 through S1002-3 have been carried out, to deposit the composite layer 110 having a total of three sub-layers 110a–110c (ω=3).

In the embodiment illustrated in FIG. 5, sub-steps S1002-1 through S1002-5 have been carried out, to deposit the composite layer 110 having a total of five sub-layers 110a–110e (ω=5). In the embodiment illustrated in FIG. 6, sub-steps S1002-1 through S1002-4 have been carried out, to deposit the composite layer 110 having a total of four sub-layers 110a–110d (ω=4). Deposition of the sub-layers 110a–110ω forms a composite layer 110, as shown in FIGS. 4, 5 and 6.

When a suitable number of sub-layers has been deposited on the semiconductor substrate, the semiconductor device having a composite layer, including a semiconductor substrate and alternating sub-layers of a high-K dielectric material and a dielectric precursor material, the sub-layers forming a composite layer on the semiconductor substrate, the composite layer having at least two sub-layers of at least one of the high-K dielectric material and the dielectric precursor material, has been formed. As noted above, the dielectric precursor material may comprise at least one of aluminum, hafnium, zirconium, yttrium, titanium, tantalum, lanthanum, cesium, tungsten, magnesium, zinc, barium, strontium, bismuth, niobium, scandium, amorphous silicon and polysilicon and combinations thereof, and the high-K dielectric material may comprise one of the high-K materials disclosed above.

Converting the Composite Layer into a Composite Dielectric Layer

In the second embodiment of the method of the present invention, the above semiconductor device including the composite layer is annealed, as shown in Step S1003 in FIG. 10. The step of annealing may result in one or both of two reactions. In the first reaction, the dielectric precursor material is oxidized to form a new dielectric material, forming alternating sub-layers of the high-K dielectric material and the new dielectric material. In the second reaction, the new dielectric material reacts or combines with the high-K dielectric material, at least at the interfaces between adjacent sub-layers, to form the composite dielectric layer 114. In an embodiment in which both reactions take place, the first and second reactions may proceed sequentially or as a single reaction, i.e., substantially simultaneously. Although not to be bound by theory, it is considered that the dielectric precursor material first may be oxidized to form the new dielectric material, and that the new dielectric material may then combine with the first, high-K dielectric material to form the reaction product. Alternatively, the dielectric precursor material may react substantially simultaneously with both the first, high-K dielectric material and the atmosphere in the annealing step, to form the reaction product.

In one embodiment, the new dielectric material is a second high-K dielectric material. In one embodiment, the new dielectric material is a standard-K dielectric material. In one embodiment, the second high-K dielectric material is not the same as the first high-K dielectric material.

In one embodiment, the composite dielectric layer includes a reaction product 114rp. The reaction product 114rp is formed by the reaction or combination of the high-K dielectric material in one sub-layer with the new dielectric material in an adjacent sub-layer. Several embodiments of the composite dielectric layer 114 are shown in FIGS. 1 and 7–9.

The annealing step is carried out at a temperature in the range from about 700° C. to about 1150° C. In one embodiment, the annealing temperature is in the range from about 950° C. to about 1100° C., and in another it is about 1000° C. to about 1050° C. In one embodiment, the annealing step is applied as an RTA technique, in which annealing is performed in $O_2$, NO, $N_2O$ or $N_2$ or mixtures thereof, for a few seconds to a few minutes. The annealing time should be sufficient to form the composite dielectric layer, as described herein. In one embodiment, the annealing time is sufficient to form both the new dielectric material and a reaction product which is a composite of the high-K dielectric material and the new dielectric material.

The annealing step, in one embodiment, is carried out in an atmosphere which includes oxygen, and in one embodiment, the atmosphere is air. In another embodiment, the atmosphere is an inert gas such as nitrogen or argon. In another embodiment, the atmosphere includes oxygen and an inert gas other than nitrogen (since nitrogen may possibly react with the dielectric precursor material). In another embodiment, the annealing step is carried out at a reduced pressure, in one embodiment under a vacuum in the range from approximately 0.01 Torr to about 1 Torr. Generally, since the dielectric precursor material may be a material such as silicon, an oxidizing atmosphere should be used in the annealing step, to assure that all of the dielectric precursor material is converted into a dielectric material.

In one embodiment, the new dielectric material thus formed is a standard-K dielectric material, and in another embodiment, the new dielectric material is a second high-K dielectric material. As a result of the annealing step, a reaction or other combination may occur between the first high-K dielectric material and the new dielectric material, at least at the interfaces between adjacent sub-layers of the respective materials, and the reaction product is formed. In one embodiment, substantially no reaction between the first high-K dielectric material and the second high-K dielectric material takes place. In this embodiment, the alternating sub-layers remain substantially discrete, as shown in FIGS. 4–6.

The annealing step may be carried out by any method and under any conditions suitable for the materials, and which will result in the formation, first of the new dielectric material from the dielectric precursor material, and second of the reaction product of which the composite dielectric layer is comprised, as will be understood by those skilled in the art.

As described above, when formed, the reaction product represents a composite of the high-K dielectric material and the new dielectric material, and may occur (a) substantially only at the interfaces between the adjacent sub-layers, or (b) both at the interfaces and extending partially through the adjacent sub-layers, or (c) substantially throughout the entirety of the sub-layers. In either of (a) or (b), the composite dielectric layer which is formed comprises at least some portion of the sub-layers of the high-K dielectric material and the new dielectric material together with at least some portion of a reaction product sub-layer. In (c), substantially the entirety of the composite dielectric layer is the reaction product.

Regardless of the degree of formation of the reaction product, substantially all of the dielectric precursor material should be transformed or converted into the new dielectric material in the annealing step.

FIGS. 7–9 show embodiments in which a reaction product is formed. FIGS. 7–9 show schematically conditions (a), (b) and (c), respectively, each following a step of annealing. In each embodiment shown in FIGS. 7–9, substantially all of the dielectric precursor material has been transformed or converted into the new dielectric material in the annealing step.

FIG. 7 shows schematically an embodiment which corresponds to condition (a), in which the reaction product has been formed substantially only at the interfaces between the respective sub-layers of the high-K dielectric material sub-layer and the dielectric precursor material sub-layer. As shown in FIG. 7, a substantial portion of each of the original sub-layers 114a–114c remain, but the sub-layers 114a114c are now separated by two additional sub-layers 114rp of the reaction product. The embodiment shown in FIG. 1 is similar to that shown in FIG. 7, and also corresponds to condition (a).

FIG. 8 shows schematically an embodiment which corresponds to condition (b), in which the reaction product has been formed both at the interfaces and extending partially through the adjacent sub-layers. As shown in FIG. 8, a portion of each of the original sub-layers 114a–114c remain, and the remaining sub-layers 114a–114c are separated by two additional sub-layers 114rp of the reaction product, which are relatively thicker than the embodiment shown in FIG. 7.

FIG. 9 shows schematically an embodiment which corresponds to condition (c), in which the reaction product has been formed substantially through the entirety of the composite dielectric layer 114. As shown in FIG. 9, the reaction product sub-layer 114rp extends substantially through the entire thickness of the composite dielectric layer 114. In one embodiment, the composite dielectric layer includes or is a substantially uniform layer of the reaction product of the high-K dielectric material and the dielectric precursor material.

The extent of formation of the reaction product sub-layer 114rp, and thereby the extent of the reaction product in the composite dielectric layer 114, can be selectively controlled by adjustment of the temperature and time of the annealing step S1003. A longer time and/or a higher temperature annealing step S1003 results in increased formation of the reaction product and a relative thickening of the reaction product sub-layer 114rp, as compared to a lower temperature or a shorter time annealing step S1003.

As will be recognized by those of skill in the art, each sub-layer 114a–114ω is quite thin. In one embodiment, the thickness of each sub-layer is in the range from about 5 Å to about 50 Å. As a result, it may be difficult to discern whether a given composite dielectric layer 114 corresponds to condition (a), (b) or (c), as described above. The thicknesses of the sub-layers are so small that it may not be possible to determine with certainty whether or to what extent discreet sub-layers remain. For example, while some metal oxides which form high-K dielectric materials are crystalline, and silicon dioxide (formed from silicon as the dielectric precursor material) is amorphous, following the annealing step S1003 the entire composite layer may be rendered amorphous, even though a small amount of discrete high-K dielectric material sub-layer remains in the composite dielectric layer 114. Suitable analytical equipment may discern the identity of the dielectric material at various levels of the composite dielectric layer 114.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A semiconductor device having a composite layer, comprising:

a semiconductor substrate; and alternating sub-layers of a high-K dielectric material and a dielectric precursor material, the sub-layers forming a composite layer on the semiconductor substrate, the composite layer having at least two sub-layers of at least one of the high-K dielectric material and the dielectric precursor material.

2. The semiconductor device of claim 1, wherein the dielectric precursor material comprises amorphous silicon or polycrystalline silicon.

3. The semiconductor device of claim 1, wherein the high-K dielectric material comprises at least one of hafnium oxide, zirconium oxide, tantalum oxide, titanium dioxide, cesium oxide, lanthanum oxide, tungsten oxide, yttrium oxide, bismuth silicon oxide ($Bi_4Si_2O_{12}$), barium strontium oxide ($Ba_{1-x}Sr_xO_3$), BST ($Ba_{1-x}Sr_xTiO_3$), PZN ($PbZn_xNb_{1-x}O_3$) and PST ($PbSc_xTa_{1-x}O_3$).

4. The semiconductor device of claim 1, wherein a first sub-layer on the semiconductor substrate is the high-K dielectric material.

5. The semiconductor device of claim 1, wherein the high-K dielectric material is hafnium oxide and the dielectric precursor material is aluminum, zirconium, yttrium, titanium, tantalum, lanthanum, cesium, tungsten, magnesium, zinc, barium, strontium, bismuth, niobium, scandium, amorphous silicon or polysilicon, or a combination thereof.

6. The semiconductor device of claim 1, wherein the high-K dielectric material is zirconium oxide and the dielectric precursor material is aluminum, hafnium, yttrium, titanium, tantalum, lanthanum, cesium, tungsten, magnesium, zinc, barium, strontium, bismuth, niobium, scandium, amorphous silicon or polysilicon, or a combination thereof.

7. The semiconductor device of claim 1, wherein the dielectric precursor material is convertible to a new dielectric material when the composite layer is subjected to annealing at an elevated temperature.

8. The semiconductor device of claim 7, wherein the new dielectric material is capable of reaction or combination with the high-K material to form a reaction product comprising a metal composite dielectric material.

9. A semiconductor device having a composite layer, comprising:

a semiconductor substrate; and alternating sub-layers of a high-K dielectric material and a dielectric precursor material, the sub-layers forming a composite layer on the semiconductor substrate, the composite layer having at least two sub-layers of at least one of the high-K dielectric material and the dielectric precursor material, wherein the dielectric precursor material is aluminum, zirconium, yttrium, titanium, tantalum, lanthanum, cesium, tungsten, magnesium, zinc, barium, strontium, bismuth, niobium, scandium, amorphous silicon or polysilicon, or a combination thereof.

10. The semiconductor device of claim 9, wherein the high-K dielectric material comprises at least one of hafnium oxide, zirconium oxide, tantalum oxide, titanium dioxide, cesium oxide, lanthanum oxide, tungsten oxide, yttrium oxide, bismuth silicon oxide ($Bi_4Si_2O_{12}$), barium strontium oxide ($Ba_{1-x}Sr_xO_3$), BST ($Ba_{1-x}Sr_xTiO_3$), PZN ($PbZn_xNb_{1-x}O_3$) and PST ($PbSc_xTa_{1-x}O_3$).

11. The semiconductor device of claim 9, wherein a first sub-layer on the semiconductor substrate is the high-K dielectric material.

12. The semiconductor device of claim 9, wherein the dielectric precursor material is convertible to a new dielectric material when the composite layer is subjected to annealing at an elevated temperature.

13. The semiconductor device of claim 12, wherein the new dielectric material is capable of reaction or combination with the high-K material to form a reaction product comprising a metal composite dielectric material.

14. A semiconductor device having a composite layer, comprising:

a semiconductor substrate; and alternating sub-layers of a high-K dielectric material and a dielectric precursor material, the sub-layers forming a composite layer on the semiconductor substrate, the composite layer having at least two sub-layers of at least one of the high-K dielectric material and the dielectric precursor material, wherein the high-K dielectric material is hafnium oxide or zirconium oxide, or a combination thereof and the dielectric precursor material is amorphous silicon or polysilicon, or a combination thereof.

15. The semiconductor device of claim 14, wherein a first sub-layer on the semiconductor substrate is the high-K dielectric material.

16. The semiconductor device of claim 14, wherein the dielectric precursor material is convertible to a new dielectric material when the composite layer is subjected to annealing at an elevated temperature.

17. The semiconductor device of claim 14, wherein the new dielectric material is capable of reaction or combination with the high-K material to form a reaction product comprising a metal composite dielectric material.

* * * * *